United States Patent [19]

Renger

[11] Patent Number: 5,126,589
[45] Date of Patent: Jun. 30, 1992

[54] PIEZOELECTRIC DRIVER USING RESONANT ENERGY TRANSFER

[75] Inventor: Herman L. Renger, Sollentuna, Sweden

[73] Assignee: Siemens Pacesetter, Inc., Sylmar, Calif.

[21] Appl. No.: 575,922

[22] Filed: Aug. 31, 1990

[51] Int. Cl.⁵ .......................... H03K 3/01; H03K 5/07
[52] U.S. Cl. ................................. 307/270; 307/246; 307/271; 310/321
[58] Field of Search ............... 307/270, 271, 308, 261, 307/246; 328/67, 113, 123, 27; 310/316, 314, 321

[56] References Cited

U.S. PATENT DOCUMENTS

| | | | |
|---|---|---|---|
| 3,292,091 | 12/1966 | Kosanke et al. | 328/67 |
| 3,585,405 | 6/1971 | Stettiner | 328/67 |
| 3,681,626 | 8/1972 | Puskas | 310/316 |
| 3,984,705 | 10/1976 | George | 310/314 |
| 4,109,174 | 8/1978 | Hodgson | 310/316 |
| 4,492,881 | 1/1985 | Anderson et al. | 307/270 |
| 4,632,311 | 12/1986 | Nakane et al. | 310/316 |
| 4,743,789 | 5/1988 | Puskas | 310/316 |
| 4,767,959 | 8/1988 | Sakakibara et al. | 310/317 |
| 4,947,074 | 8/1990 | Suzuki | 310/316 |

FOREIGN PATENT DOCUMENTS 0041681 2/1990 Japan ...................... 310/314

Primary Examiner—John Zazworsky
Attorney, Agent, or Firm—Malcolm J. Romano; Leslie S. Miller

[57] ABSTRACT

A drive circuit for use with a capacitive load includes two transistors controlled by a drive voltage and connected to the load through an inductor. A supply voltage is alternately connected and disconnected to the circuit to achieve a resonant transfer of energy from the supply voltage. Energy stored in the load is transferred to the inductor and then back to the load, thereby reversing and augmenting the output voltage across the load and providing an instantaneous output voltage many times the supply voltage. Diodes ensure that the current flows in the proper polarity through the transistors.

8 Claims, 3 Drawing Sheets

PIEZOELECTRIC DRIVER USING RESONANT ENERGY TRANSFER

BACKGROUND OF THE INVENTION

1. Field of the Invention

This invention relates generally to electrical circuits for piezoelectric elements and, more particularly, to efficient drive circuits for a capacitive load such as a piezoelectric element.

2. Description of the Related Art

In applications where a piezoelectric element or similar capacitive-type load is coupled to a drive circuit, it is desirable to produce a high output to the load without wasting a great amount of energy. Piezoelectric elements are commonly used to generate an audible alarm by driving them with an AC voltage, which causes the piezoelectric elements to vibrate at their natural oscillation frequency and in time with the voltage, producing a sound. This is especially useful where it is important that the circuit elements not take up much space, such as in a heart pacemaker. A piezoelectric element is smaller and requires less energy to drive than an electromagnetic device, and can be supplied with energy from very compact batteries. The piezoelectric element also can be used in an implanted drug pump, the vibrations of the element being used to initiate the flow of a drug into the body.

The efficiency of the drive circuit can be increased, and the amount of energy dissipated as heat or otherwise lost can be decreased, by using a resonant drive circuit where the piezoelectric element, or capacitive load, is connected in series with an inductive element. The two form what is known as an L-C circuit, in which an inductor (L) and capacitor (C) comprise reactive elements whose impedances change with the frequency of an applied voltage. An L-C circuit has a resonant frequency at which the reactive impedances of the inductor and capacitor exactly cancel each other, and at which maximum energy transfer occurs. As a consequence, the L-C circuit comprises a resonant energy transfer system that can produce an instantaneous output voltage to the capacitor many times larger than the supply voltage with minimal energy lost as heat. The frequency at which resonance occurs will depend on the inductance and capacitance values.

In an L-C resonant drive circuit, if the piezoelectric element is to be used to produce an audible signal, the element must vibrate in the audible frequency range, preferably at approximately 1 kHz. That is, the supply voltage must be applied at this frequency. Typical piezoelectric elements that vibrate in this frequency range and that are suitable for implantation have capacitance values for which corresponding inductors are unfortunately too large to be implanted. Moreover, an inductor small enough to be implanted, when combined with a typical piezoelectric element, would correspond to a resonant frequency on the order of 100 kHz, well above the frequency range of human hearing.

From the discussion above, it should be apparent that there is a need for a resonant drive circuit for use with a piezoelectric element vibrating at an audible frequency and providing high energy efficiency while being of implantable size. The present invention satisfies this need.

SUMMARY OF THE INVENTION

The present invention provides a resonant energy transfer system, for transferring energy from a supply voltage source to a capacitive load, comprising a drive circuit that makes use of otherwise lost energy stored in the load and returns it back to the load, that operates under a wide range of drive frequencies, and that cyclically produces peak voltages at the capacitive load that are substantially greater than the supply voltage. In accordance with the present invention, the drive circuit includes an inductive element that is connected in series with the capacitive load. The load and the inductive element form an L-C circuit capable of storing electrical energy. The supply voltage charges the load to the supply voltage level during the first quarter of the drive circuit voltage cycle while a current flows through the inductive element. When the capacitive load reaches a voltage level equal to the supply voltage, the current through the inductive element peaks and the inductive element reaches its maximum energy storage level. It then delivers its stored energy back to the load in the form of a decreasing current. As the inductive element augments the load's charge after the current peak, the current in the inductive element decreases to zero as the load voltage swings about the supply voltage and increases to its peak value.

After a predetermined waiting time interval, the second half of the voltage cycle is started when the supply voltage is removed from the circuit and the capacitive load is discharged and, in doing so, transfers energy back to the inductive element while current in the circuit flows in the opposite or negative direction from before. When the load voltage reaches zero, the current through the inductive element reaches its peak negative value and then delivers its stored energy back to the load. That is, the energy from the inductive element induces a charge on the capacitive load symmetric about a reference voltage, such as ground or zero, until the current through the inductive element again reaches zero, ending the cycle with the load having its peak negative voltage.

After a predetermined waiting time interval, the process can be resumed with the application of the supply voltage to the capacitive load and the discharging of the load. The capacitive load, for example, can comprise a piezoelectric element for providing an audible warning signal or for driving a drug pump. The augmented charging and discharging, which theoretically could continue indefinitely, is limited by system losses but nevertheless can produce an instantaneous output voltage many times the supply voltage. The output can advantageously be controlled by a peak controller that limits the voltage produced at the capacitive load.

The charging and discharging of the inductive element and capacitive load, and the transferring of the stored energy from the load and the inductive element back to the inductive element and the load, respectively, can be controlled by a pair of MOSFET-type transistors of opposite polarity that are connected to the inductive element and capacitive load by a pair of diodes. A single square wave voltage source can be connected to each of the transistors gates to thereby control the transistors, whose drains are connected to the diodes. One of the transistors is connected to the supply voltage and the other is connected to ground. Using one of the transistors to control application of the supply voltage and the other to apply a reference potential or ground, the system transfers energy between the inductive element and the load in symmetric swings about the supply voltage and the reference potential. The diodes help ensure that current is provided to the appropriate transistor. Repeated cyclic transfers of this type can produce an instantaneous output voltage many times the supply voltage, limited in practical terms only by system losses and what is known as the quality factor of the circuit.

The charging and discharging of the inductive element and the capacitive load can be controlled by a pair of MOSFET-type transistors in conjunction with a peak controller to cut off the charging of the load when the magnitude of the voltage across the load is above a predetermined level. This prevents the transferring of the load voltage from the inductive element to be symmetric about the supply voltage and can be used, for example, to make the transferring of the load voltage to be symmetric about the reference voltage. In this way, the voltage can be augmented up to a predetermined level, thereby producing an output voltage still many times the supply voltage but controlled to a useful level.

Other features and advantages of the present invention will become apparent from the following detailed description, taken in conjunction with the accompanying drawings, which illustrate by way of example, the principles of the invention.

DESCRIPTION OF THE PREFERRED EMBODIMENT

Figure 1:
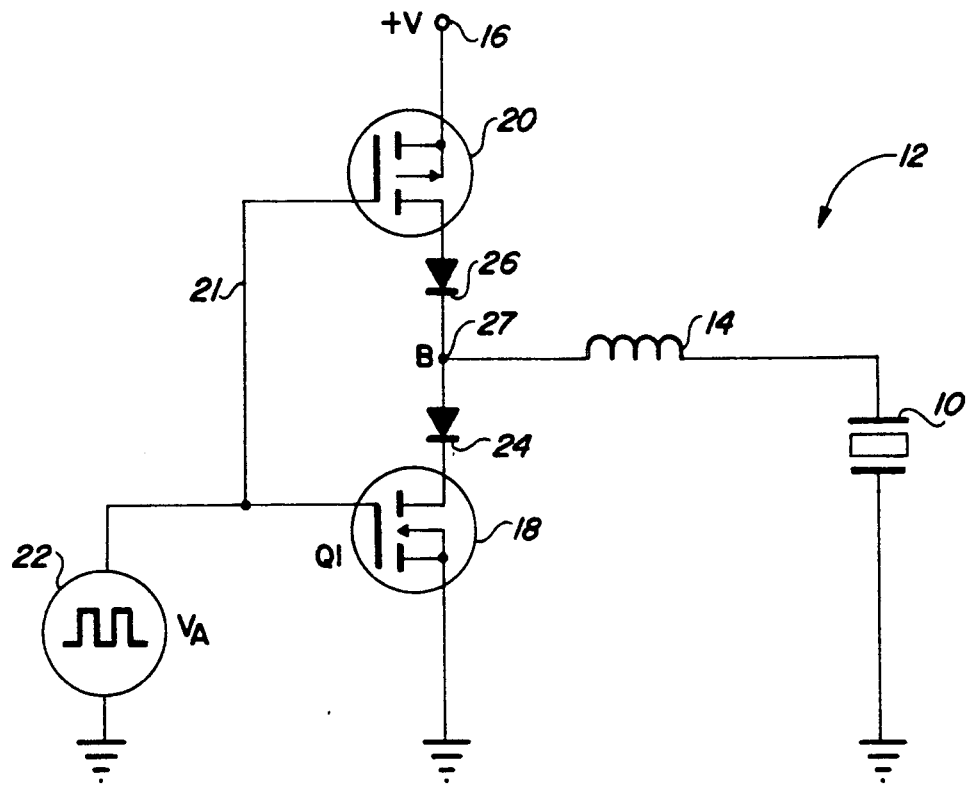
FIG. 1 is a schematic diagram of a drive circuit in accordance with the present invention.

A resonant energy transfer system in accordance with the present invention is illustrated in FIG. 1, and has utility in an implantable heart pacemaker, drug pump, or the like. The system includes a piezoelectric element 10 connected to a drive circuit 12. As known to those skilled in the art, the piezoelectric element vibrates when it is driven by an AC voltage. This makes the piezoelectric element suitable for audible alarms or implantable drug pumps. An inductor 14 of the drive circuit is connected in series with the piezoelectric element.

A supply voltage source 16 is connected to the circuit 12 and produces a voltage +V that is supplied to the piezoelectric element 10 and inductor 14. Together, the piezoelectric element and inductor comprise an L-C circuit having a resonant frequency $f_R$ at which maximum energy transfer occurs. This decreases the amount of energy that is wasted as heat, which is critical for applications where the system is to be implanted. Unfortunately, an inductor that is small enough to be implanted in a human body typically has a resonant frequency that, along with a typical corresponding piezoelectric element, results in a resonant frequency on the order of 100 kHz. This is well above the frequency range of human hearing. An inductor that would provide a low enough resonant frequency for the circuit, on the order of 1 kHz, is too large to be implanted. The circuit 12 makes it possible to drive the piezoelectric element with a voltage that will produce an audible vibration while producing resonant transfer of energy such that an output voltage much larger than the supply voltage can be produced.

The drive circuit 12 includes a first transistor 18 and a second transistor 20. The transistors advantageously comprise MOSFET-type transistors of opposite polarity whose gate terminals are connected via a line 21 to a square-wave voltage source 22 producing a drive voltage $V_A$ having a predetermined frequency. That is, a single drive voltage controls both transistors. The drain terminals of the first and second transistors 18 and 20 are connected to the inductor 14 by first and second diodes 24 and 26, respectively. The cathode side of the first diode is connected to the first transistor, while the anode side of the second diode is connected to the second transistor. The diodes are connected at a common junction 27 labeled B. The supply voltage source 16 is connected to the source terminal of the second transistor. The source terminal of the first transistor is connected to a reference voltage, such as ground.

Figure 2:
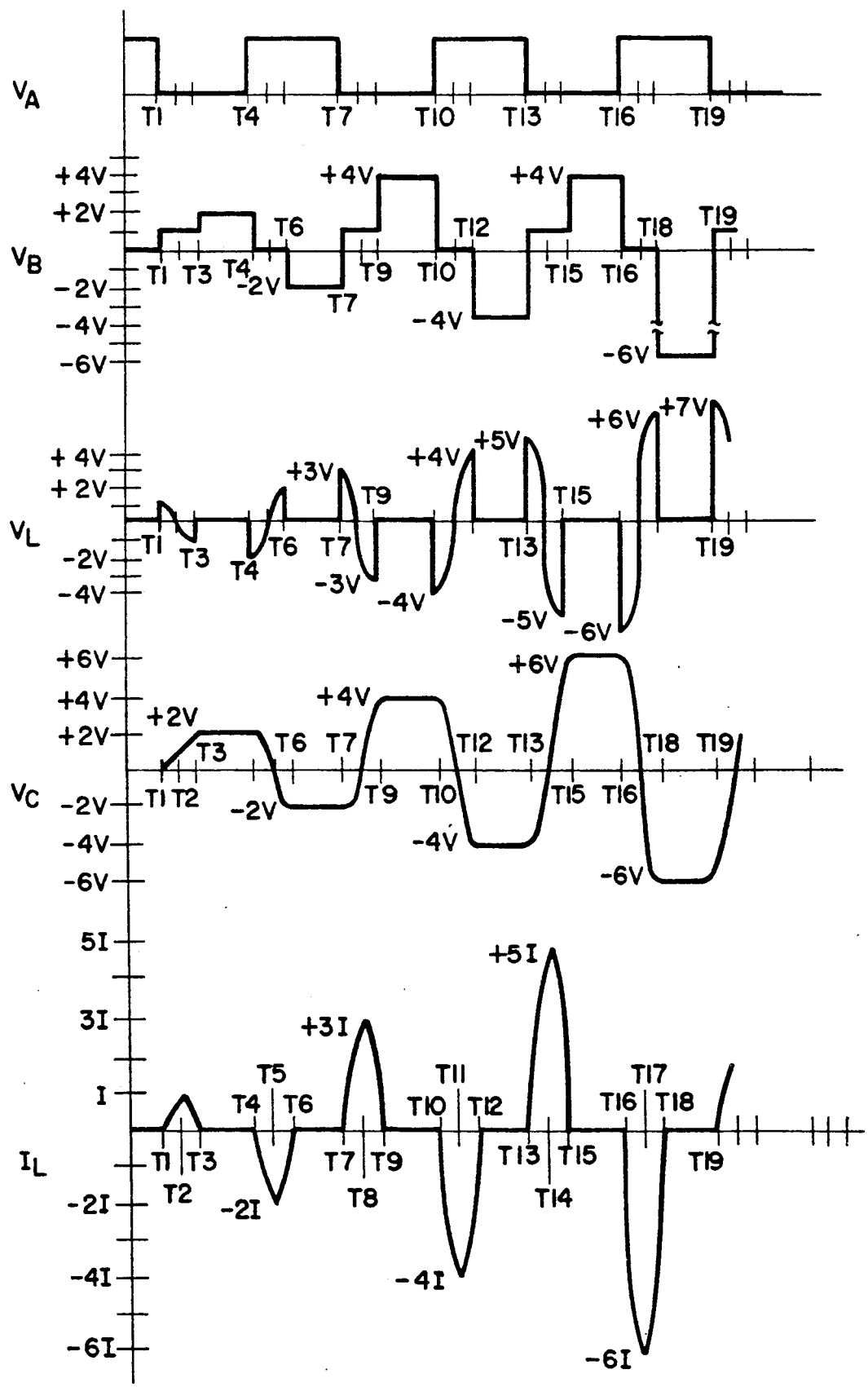
FIG. 2 is a timing diagram for various waveforms of the drive circuit illustrated in FIG. I.

The operation of the system illustrated in FIG. 1 is best understood with reference to the timing diagrams of FIG. 2, which illustrate the drive voltage $V_A$, the voltage $V_B$ of the junction 27, the voltage $V_L$ of the inductor 14, the voltage $V_C$ of the piezoelectric element 10, and the inductor current $I_L$. As known to those skilled in the art, the piezoelectric element acts like a capacitive load and therefore it stores energy, as does the inductor. In FIG. 2, the piezoelectric element 10 is initially without charge, or is at zero voltage, and the drive voltage $V_A$ is high. The first transistor 18 is an n-channel or NMOS-type MOSFET and the second transistor 20 is a p-channel or PMOS-type MOSFET. Therefore, when the drive voltage is high, the first transistor is biased on, or is put in a conducting state, and the second transistor is biased off, or put in a non-conducting state.

At time T1, the drive voltage $V_A$ drops to zero, so that the first transistor 18 is biased off and the second transistor 20 is biased on. Because the second transistor is now conducting, a current flows in the drive circuit 12, creating an inductor current $I_L$ and charging the capacitive load to a voltage level equal to the supply voltage +V in a time period equal to one quarter the cycle time of the resonant frequency $f_R$. When the voltage $V_C$ on the capacitive load reaches the supply voltage, at time T2, the energy stored in the inductor 14 reaches its maximum value as the inductor current $I_L$ reaches its maximum, while the inductor voltage $V_L$ reaches zero. The energy stored in the inductor continues to charge the load as the inductor current decreases to zero at time T3. That is, the energy stored in the inductor has decreased to zero when the inductor current reaches zero and the voltage across the load reaches +2 V, at time T3 in another quarter cycle of the resonant frequency $f_R$. The time interval from T1 to T3 represents one-half the cycle time at the resonant frequency of the L-C circuit. At time T3, the capacitive load is charged but cannot discharge through the second diode 26, which is reverse-biased as indicated by the voltage at $V_B$ in FIG. 2. Thus, the diode stops the current at half-cycle and prevents it from swinging back in the reverse direction. Therefore, the transistor timing for biasing on and off is not as critical as it otherwise would be, as the diode helps control the current direction to the correct transistor.

The time interval from T3 to T4 constitutes a waiting time interval, after which the second half of the drive circuit 12 voltage cycle is begun when the drive voltage $V_A$ again becomes high at T4. The waiting time interval is typically part of a predetermined interval from time T1 to T4 that depends on the desired frequency of voltage applied to the piezoelectric load 10, and is controlled by the drive voltage source 22. When the drive voltage becomes high at time T4, the first transistor 18 is biased on, or begins conducting, and the second transistor 20 is biased off. The supply voltage $+V$ is thereby cut off from the circuit, and the piezoelectric load discharges through the first diode 24 and the first transistor.

When the piezoelectric load 10 discharges, current flows through the inductor 14 again, but in the opposite direction from before. The inductor current $I_L$ reaches its negative peak at time T5 after another quarter cycle when the piezoelectric load has fully discharged and the inductor voltage $V_L$ is equal to zero. That is, all the energy previously stored in the load 10 is now stored in the inductor 14 as the load voltage has gone from $+2$ V to zero. The inductor then releases its stored energy, again in the opposite direction from before, and therefore releases sufficient energy from time T5 to T6 to charge the load to an equal but opposite charge as before, that is, from zero to $-2$ V. Thus, at time T6, the inductor current $I_L$ reaches zero and the piezoelectric voltage $V_C$ reaches $-2$ V.

After another waiting time interval from time T6 to T7, the first voltage cycle is ended when the drive voltage $V_A$ again drops at time T7. Again, the waiting time interval on $V_A$ is controlled by the drive voltage source 22. When the drive voltage $V_A$ drops at time T7, the second transistor 20 again conducts, and the supply voltage $+V$ is again connected to the inductor 14 and piezoelectric element 10. Once again, current will flow through the inductor until the voltage across the piezoelectric load is equal to the supply voltage, $+V$, at time T8. At this point, current through the inductor reaches its maximum, and the inductor is fully charged. The inductor then releases its energy into the load from time T8 to T9, augmenting the charge on the load.

Because the voltage across the load changed during time T7 to T8 from $-2$ V to $+V$ while the inductor was being charged, a change of three supply voltage units V, the energy released during time T8 to T9 from the inductor as it discharges will correspond to the higher voltage and therefore will be sufficient to increase the voltage across the load by three supply voltage units. Therefore, the voltage across the piezoelectric load 10 during time T8 to T9 will swing about the supply voltage and will increase from $+V$ to $+4$ V. At time T9, the inductor has released all of its energy, the inductor current $I_L$ has dropped to zero, and the voltage across the load has reached its maximum. After a waiting time interval from time T9 to T10, the next half of the voltage cycle begins when the drive voltage $V_A$ rises at time T10.

At the beginning of the second half of the second voltage cycle at time T10, the second transistor 20 is biased off and the first transistor 18 begins conducting when $V_A$ rises. This discharges the piezo-electric load 10, which produces a current through the inductor 14. The inductor current reaches its peak at time T11 when the voltage across the load goes from $+4$ V to zero, a difference across the load of four supply voltage units. Therefore, when the inductor releases its stored energy in the opposite direction from time T11 to T12, charging the piezoelectric load to an opposite polarity, the inductor produces a load voltage having an equal but opposite magnitude, namely, $-4$ V. After a waiting time interval from time T12 to T13, the second voltage cycle terminates at time T13 and the third voltage cycle begins when the drive voltage $V_A$ again drops and the load voltage $V_C$ swings symmetrically about the supply voltage, changing from $-4$ V to $+V$ and from $+V$ to $+6$ V.

For resonant energy transfer, the supply voltage should be applied at a frequency less than the resonant frequency $f_R$ of the circuit 12 in combination with the load 10. The waiting time interval during each half cycle, such as the interval from time T3 to T4 and from time T6 to T7, can be selected to produce the desired audio output where the capacitive load comprises a piezoelectric element. For example, if the L-C circuit in accordance with the invention comprises the piezoelectric element 10 and the inductor 14 and has a resonant frequency of 100 kHz, making them small enough to be implanted, then a complete cycle of charging and recharging would comprise two polarity reversals on the piezoelectric load and, with no waiting time interval, would occur 200,000 times per second and take five microseconds to complete. That is, the supply voltage would be applied at the resonant frequency of the L-C circuit and the piezoelectric element would vibrate accordingly.

If, however, the time interval for each half cycle is controlled by the drive voltage source 22 to increase from five microseconds to one-half of a millisecond (500 microseconds), making the time for a complete cycle from time T1 to T7, for example, equal to 1000 microseconds, the piezoelectric element will vibrate at a frequency of approximately 1 kHz. Thus, even though the inductive and capacitive components might be small enough to be implanted and, therefore, have a resonant frequency beyond the audible range, the circuit 12 can utilize a predetermined half-cycle time period to produce an audible frequency at the capacitive load while still providing resonant application of energy from the supply 16. Thus, the waiting time interval is contained within the half-cycle time. Moreover, using a single drive signal $V_A$ simplifies the control of the two transistors 18 and 20. The use of a single drive signal is made possible by the selection of two transistors of opposite polarity.

In theory, the augmented charging and discharging of the capacitive load 10 about the supply voltage $+V$ could continue indefinitely. In actuality, the swings in voltage are not quite so large as depicted, due to losses in the various circuit components, and are limited by a circuit characteristic known as the quality factor, Q. That is, the maximum instantaneous output voltage across the load will be (2Q) times the supply voltage divided by the constant PI, or $(2Q)(+V)/(PI)$. As known to those skilled in the art, Q is equal to the ratio of the reactive element impedance, L or C, to the pure resistance of the circuit. In practice, the Q value can be on the order of 50 or 100. Thus, the resonant energy transfer circuit 12 can generate an output voltage having an instantaneous output value much greater than the supply voltage.

Figure 3:
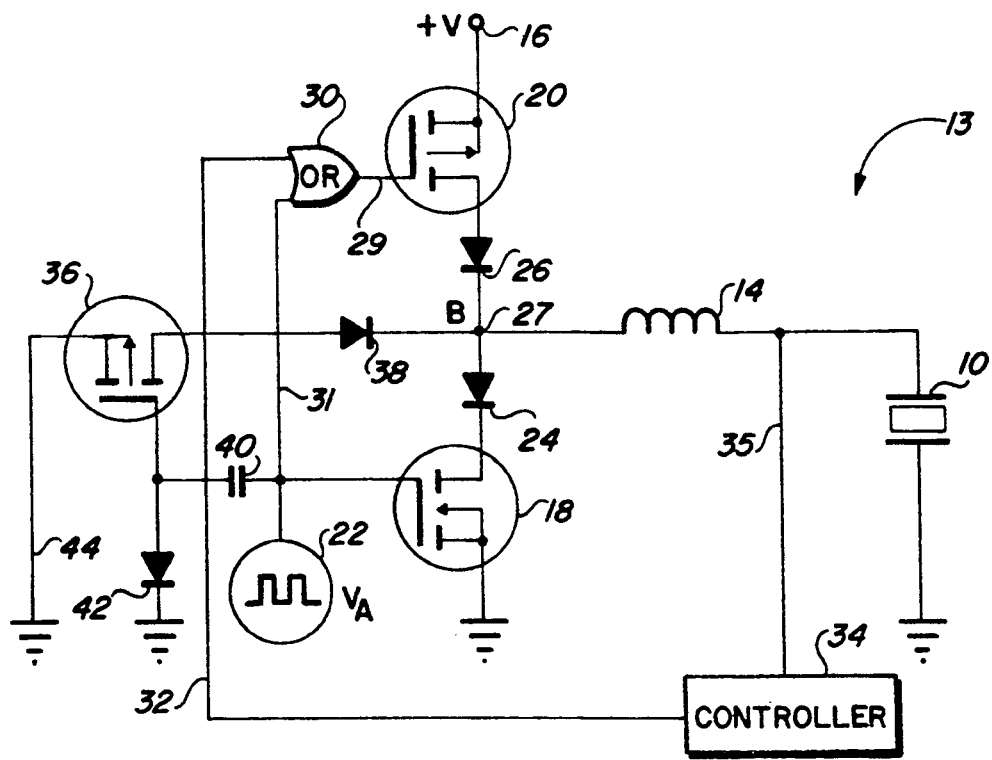
FIG. 3 is a schematic diagram of a drive circuit of the type illustrated in FIG. 1, further incorporating a peak controller.

FIG. 3 is a diagram of a drive circuit 13 in which the positive swing of the output voltage can be precisely controlled, and made to swing about a reference potential, such as ground or zero, rather than the supply voltage +V when an energy increase is not wanted. The circuit illustrated in FIG. 3 includes the same basic elements as illustrated in FIG. 2, in which like elements have like reference numerals. Therefore, transistors of opposite polarity are used. In FIG. 3, however, the gate of the second transistor 20 is connected to an OR-gate 30. One input terminal of the OR-gate is connected via a line 31 to the drive signal source 22, while the other input terminal of the OR-gate is connected via a line 32 to a controller 34. The controller is connected via a line 35 to the circuit between the inductor 14 and the piezoelectric load 10. When the magnitude of the load voltage gets larger than a predetermined amount, such as +4 V, the controller raises its output level on the line 32 to the OR-gate, thereby biasing the second transistor 20 off and cutting off the supply voltage source 16, limiting any additional transfer of energy to the load.

A third MOSFET-type transistor 36 is coupled to the circuit 13 by the anode side of a third diode 38. The cathode side of the third diode is connected to the junction point 27. The gate terminal of the third transistor is coupled by a coupling capacitor 40 to the drive signal source 22. The third transistor is of the same polarity as the second transistor 20, and therefore the third transistor turns on and off with the drive signal $V_A$ as did the second transistor 20 in FIG. 2. signal The gate terminal of the third transistor is also connected to the reference voltage by a fourth diode 42. The fourth diode ensures that only negative voltage is coupled to the gate of the third transistor. Finally, the source terminal of the third transistor is connected via a line 44 to the reference potential.

Those skilled in the art will recognize that the third transistor 36 and the second transistor 20 are similarly connected to the L-C circuit comprising the piezoelectric load 10 and the inductor 14, their drains being connected by diodes to the junction point 27 and their gates being connected to the drive signal source 22, the difference being that the second transistor's gate is connected to the drive signal via the OR-gate 30 via a line 29 and its source terminal is connected to the supply voltage source 16, while the third transistor's gate is connected to the drive signal via the coupling capacitor 40 and its source terminal is connected to the reference potential, or ground. Thus, by using the controller 34 to bias off the second transistor, the positive swing of the voltage across the load can be made to swing about ground, or zero, rather than the supply voltage +V. The diodes 24 and 38 are used to steer the current, so that the transistor that receives current is the one that needs current. In addition, the diodes 24, 26, and 38 help to catch the current at a half-cycle point to control the charging and recharging cycles of the load 10. In this way, the voltage level across the load 10 is kept to a predetermined maximum value.

Figure 4:
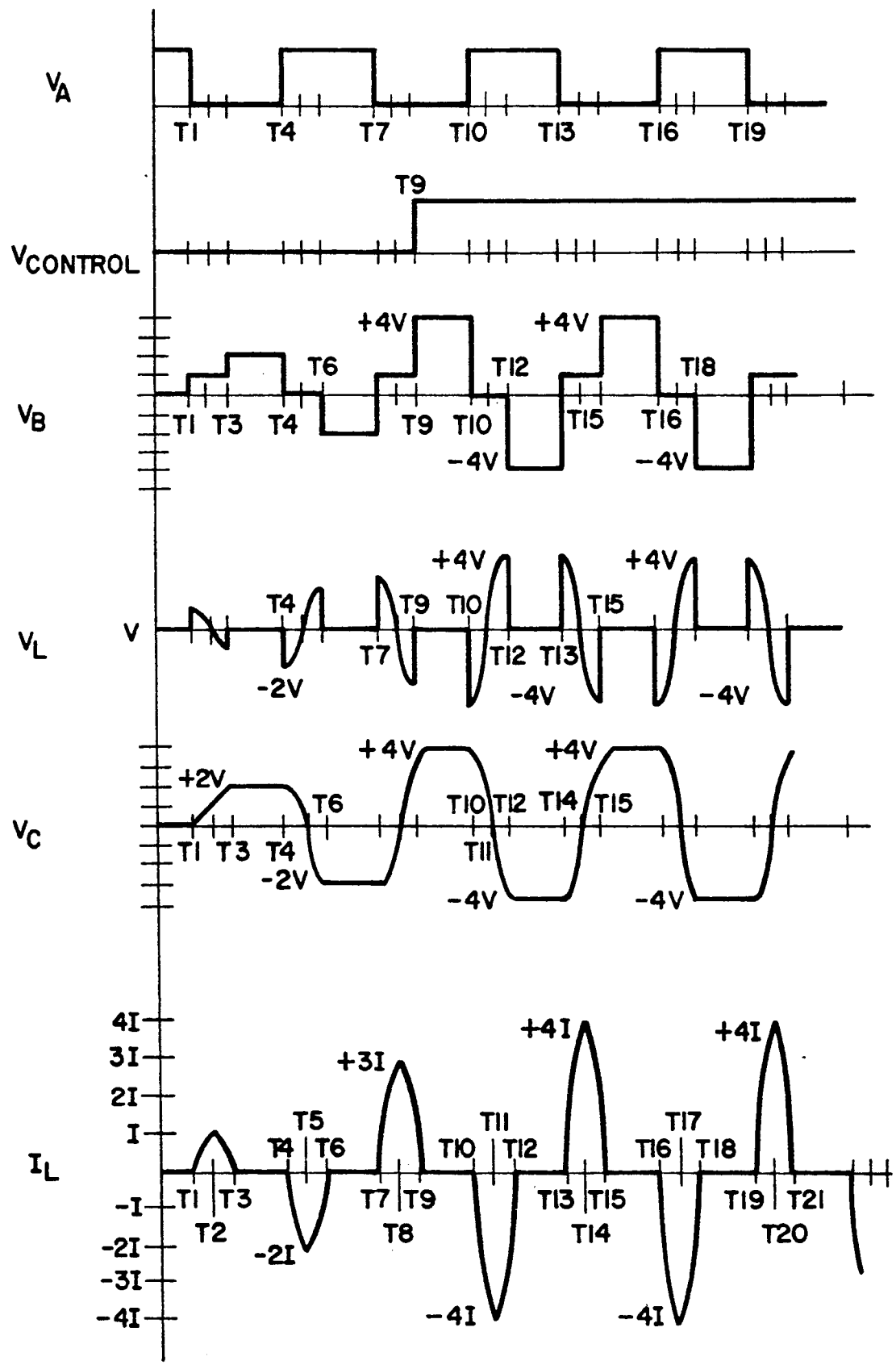
FIG. 4 is a timing diagram for various waveforms of the drive circuit illustrated in FIG. 3.

The operation of the FIG. 3 circuit is best understood with reference to the timing diagrams of FIG. 4. The timing diagrams illustrate the drive voltage $V_A$ and controller voltage $V_{CONTROL}$, the voltage $V_L$ of the inductor 14, the voltage $V_C$ of the piezo-electric element 10, and the inductor current $I_L$. In the example illustrated in FIG. 4, the controller 34 of the drive circuit 13 is selected to allow a maximum load voltage $V_C$ of +4 V. The first voltage cycle and part of the second cycle, from time T1 through time T9, is identical to that shown in FIG. 2. Therefore, the waiting time intervals are controlled by the drive signal source 22 to produce the desired frequency, and the second voltage cycle begins at time T7 when $V_A$ drops, biasing on the second transistor 20 and the third transistor 36, and connecting the supply voltage source 16 to the circuit and discharging the load 10. At time T8, the voltage across the load has swung from −2 V to zero and up to +V, and begins to swing upwardly about the supply voltage to reach its peak of +4 V at time T9.

At time T9, the controller 34 recognizes that the maximum load voltage of +4 V has been reached, and raises its output level $V_{CONTROL}$ on the line 32, thereby raising the output of the OR-gate 30 on the line 29, biasing off the second transistor 20 and removing the supply voltage source 16 from the circuit 13. The third transistor 36 remains conducting, however, and therefore any positive current can continue to flow through the inductor 14, through the load 10, into ground, up through the line 44, through the third transistor 36 and the third diode 38, and back to the inductor. Thus, the diodes 24, 26, and 38 help to steer the current to the right transistor. After a waiting time interval, the drive signal $V_A$ again becomes high, turning on the first transistor 18, thereby discharging the capacitive load 10, charging the inductor and recharging the load to −4 V, and so on. Thus, the voltage across the capacitive load can be set to alternate about a predetermined value, such as zero, rather than continuing to swing symmetrically in increasing amplitude about the supply voltage +V on positive voltage swings.

The present invention therefore uses a supply voltage and an L-C circuit to provide resonant transfer of energy from a capacitive load to an inductive element and back to the capacitive load, making use of energy that otherwise would be dissipated as heat. Furthermore, the circuit operates under a wide range of drive frequencies. That is, where a predetermined frequency is desired for driving a capacitive load that is a piezoelectric element, the components can be selected for optimal size, such as for implantation, and the piezoelectric frequency of vibration can be set to the desired amount by adjusting a waiting time interval. Finally, the circuit is capable of producing instantaneous peak voltages across the capacitive load that are many times the size of the supply voltage. The present invention thereby provides an extremely efficient transfer of energy and a wide range of applications.

While the present invention has been described with respect to preferred embodiments, it is to be understood that variations may occur to those skilled in the art without departing from the teachings of the present invention. For example, the controller can be selected to respond to any condition that corresponds to the occurrence of the maximum load voltage desired, such as maximum power output or drug pump pressure. The invention, therefore, should not be seen as limited to the particular apparatus described herein, but it should be understood that the present invention has wide applicability with respect to the resonant piezoelectric driver circuits. Such alternative configurations can be achieved by those skilled in the art in view of the description above.

What is claimed is:

1. A drive circuit for driving a capacitive load, comprising:
an inductive element having a first terminal and a second terminal, connected at its first terminal in series with the capacitive load and forming an L-C circuit having a resonant frequency;
a supply voltage source;

a reference voltage source;

switching means for alternately connecting the second terminal of the inductive element to the supply voltage source and then to the reference voltage source at a predetermined frequency, such that the voltage across the capacitive load reaches a first level when the current through the inductive element reaches its peak, and then energy is transferred from the inductive element to the capacitive load until the voltage across the capacitive load reaches a second level higher than the first level during a first part of the alternating cycle, and the capacitive load discharges energy into the inductive element until current through the inductive element reaches a peak having the opposite polarity and a greater magnitude than the first inductive element current peak, producing a third voltage level across the capacitive load equal in magnitude an opposite in polarity from the second level during a second part of the alternating cycle, and the alternating cycle is then begun again, whereby the transfer of energy occurs at the resonant frequency of the L-C circuit, and the voltage across the capacitive load is augmented by the energy from the supply voltage source through the inductive element, and increases with each alternating cycle; and controller means, connected between the switching means and the L-C circuit, for responding to a predetermined voltage level in the L-C circuit by disconnecting the supply voltage source from the L-C circuit when the voltage level in the L-C circuit exceeds the predetermined voltage level.

2. A drive circuit as recited in claim 1, wherein the switching means comprises:

a first MOSFET having a gate, a drain, and a source, the source of the first MOSFET being coupled to the supply voltage source;

a second MOSFET having a gate, a drain, an a source, the source of the second MOSFET being coupled to the reference voltage source;

a first diode connecting the drain of the first MOSFET to the second terminal of the inductive element;

a second diode connecting the drain of the second MOSFET to the second terminal of the inductive element; and drive means for producing a cyclic drive voltage having a predetermined cycle time including a waiting time interval and being connected to the gate of each MOSFET; wherein the cyclic drive voltage controls the first MOSFET and second MOSFET such that when the first MOSFET is conducting the second MOSFET is nonconducting, and when the second MOSFET is conducting the first MOSFET is nonconducting.

3. A drive circuit as recited in claim 2, wherein the drive means controls the drive voltage such that the cycle time of the drive voltage results in a drive voltage frequency that is lower than the L-C circuit resonant frequency.

4. A drive circuit as recited in claim 2, further comprising:

a third MOSFET having a gate coupled to the drive means, a source coupled to the reference voltage source, and a drain;

a third diode connecting the drain of the third MOSFET to the second terminal of the inductive element; and whereby the conductive state of the third MOSFET changes in accordance with the value of the cyclic drive voltage.

5. A drive circuit for use with a capacitive load, the capacitive load having a first terminal and a second terminal and being connected at its first terminal to a reference voltage source, the drive circuit comprising:

an inductor having a first terminal and a second terminal, the inductor being connected at its first terminal in series with the second terminal of the capacitive load and forming an L-C circuit having an L-C circuit resonant frequency;

a supply voltage source producing a voltage at a supply potential of +V with respect to the reference voltage source; and switching means for alternately connecting the second terminal of the inductor to the supply voltage source and then to the reference voltage source, wherein the switching means comprises:

a first MOSFET having a gate, a drain, and a source, the source of the second MOSFET coupled to the reference potential source;

a second MOSFET complementary to the first MOSFET, having a gate, a drain, and a source, the source of the second MOSFET coupled to the supply voltage source;

a first diode connecting the drain of the first MOSFET to the second terminal of the inductor;

a second diode connecting the drain of the second MOSFET to the second terminal of the inductor;

drive means, connected to the gage of each MOSFET, for producing a cyclic drive voltage having a predetermined frequency less than the L-C circuit resonant frequency and for controlling the first MOSFET and second MOSFET such that when the first MOSFET is conducting the second MOSFET is nonconducting and when the second MOSFET is conducting the first MOSFET is nonconducting; and controller means, connected to the L-C circuit, for responding to a predetermined voltage level in the L-C circuit when the voltage level in the L-C circuit exceeds the predetermined voltage level by biasing off the second MOSFET, thereby disconnecting the supply voltage source from the L-C circuit.

6. A drive circuit as recited in claim 5, wherein the control means comprises:

a third MOSFET having a gate, a drain, and a source, the gate of the third MOSFET coupled to the drive means and the source of the third MOSFET coupled to the reference voltage source;

a third diode connecting the drain of the third MOSFET to the second terminal of the inductor; and peak responding means, connected to the L-C circuit, for responding to a predetermined voltage level in the L-C circuit to render the second MOSFET nonconductive when the voltage level in the L-C circuit exceeds the predetermined voltage level.

7. A drive circuit for use with a capacitive load, the drive circuit comprising:

an inductive element having a first terminal and a second terminal, connected at its first terminal in series with the capacitive load and forming an L-C circuit having a resonant frequency;

a supply voltage source;

a reference voltage source;

switching means for alternately connecting, at a predetermined frequency less than the resonant frequency of the L-C circuit, the second terminal of the inductive element to the supply voltage source for causing current to flow through the inductive element in a first direction and then to the reference voltage source for causing current to flow through the inductive element in a direction opposite to the first direction; and energy limiting means, connected to the L-C circuit, for responding to a predetermined voltage level in the L-C circuit by disconnecting the supply voltage source from the L-C circuit when the voltage level in the L-C circuit exceeds the predetermined voltage level.

8. A method of driving a capacitive load with a supply voltage, the capacitive load being connected to an inductive element that together with the load comprises an L-C circuit having a resonant frequency, comprising the steps of:

connecting the supply voltage through a first diode to the L-C circuit for a predetermined time interval at least equal to one-half the cycle time of the L-C circuit resonant frequency, such that the capacitive load voltage reaches a first load voltage level and the inductive element current reaches an inductive current value;

allowing the current through the inductive element to decrease to zero during the predetermined time interval as the load voltage reaches a second load voltage level greater than the supply voltage;

disconnecting the supply voltage from the L-C circuit after the predetermined time interval has expired, allowing the load to discharge its energy into the inductive element through a second diode and allowing the inductive element to discharge its energy back into the load, producing a third load voltage level at least substantially equal in magnitude and opposite in polarity from the second load voltage level;

detecting when the second load voltage level exceeds a predetermined desired peak value; and causing the current in the L-C circuit to flow through a third diode to the reference voltage source, instead of the supply voltage source, thereby limiting the load voltage level to substantially the peak value.

* * * * *